United States Patent
Lee et al.

(10) Patent No.: US 7,955,950 B2
(45) Date of Patent: Jun. 7, 2011

(54) SEMICONDUCTOR-ON-INSULATOR SUBSTRATE WITH A DIFFUSION BARRIER

(75) Inventors: Junedong Lee, Hopewell Junction, NY (US); Dominic J. Schepis, Wappingers Falls, NY (US); Jeffrey W. Sleight, Ridgefield, CT (US); Zhibin Ren, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 702 days.

(21) Appl. No.: 11/874,565

(22) Filed: Oct. 18, 2007

(65) Prior Publication Data

US 2009/0102026 A1    Apr. 23, 2009

(51) Int. Cl.
*H01L 21/46* (2006.01)
(52) U.S. Cl. ......................... 438/458; 438/479
(58) Field of Classification Search .......... 438/458–459, 438/479–480, E21.474, E27.112
See application file for complete search history.

(56) References Cited

U.S. PATENT DOCUMENTS

| | | | |
|---|---|---|---|
| 5,374,564 A | 12/1994 | Bruel | |
| 5,658,809 A | 8/1997 | Nakashima et al. | |
| 5,714,395 A | 2/1998 | Bruel | |
| 5,930,634 A | 7/1999 | Hause et al. | |
| 5,930,643 A | 7/1999 | Sadana et al. | |
| 6,043,166 A | 3/2000 | Roitman et al. | |
| 6,090,689 A | 7/2000 | Sadana et al. | |
| 6,372,609 B1 | 4/2002 | Aga et al. | |
| 6,486,037 B2 | 11/2002 | Norcott et al. | |
| 6,541,356 B2 | 4/2003 | Fogel et al. | |
| 6,602,757 B2 | 8/2003 | Hovel et al. | |
| 6,613,678 B1 | 9/2003 | Sakaguchi et al. | |
| 6,846,727 B2 | 1/2005 | Fogel et al. | |
| 7,081,399 B2 | 7/2006 | Maleville et al. | |
| 7,436,034 B2 * | 10/2008 | Callegari et al. | 257/407 |
| 2002/0070454 A1 | 6/2002 | Yasukawa | |
| 2003/0218212 A1 * | 11/2003 | Lee et al. | 257/347 |
| 2003/0232466 A1 | 12/2003 | Zistl et al. | |
| 2007/0063279 A1 | 3/2007 | Tolchinsky et al. | |
| 2010/0219512 A1 * | 9/2010 | Tada et al. | 257/632 |

* cited by examiner

*Primary Examiner* — Cuong Q Nguyen
(74) *Attorney, Agent, or Firm* — Scully, Scott, Murphy & Presser, P.C.; Steven Capelle, Esq.

(57) ABSTRACT

A diffusion barrier layer is incorporated between a top semiconductor layer and buried oxide layer. The diffusion barrier layer blocks diffusion of dopants into or out of buried oxide layer. The diffusion barrier layer may comprise a dielectric material such as silicon oxynitride or a high-k gate dielectric material. Alternately, the diffusion barrier layer may comprise a semiconductor material such as SiC. Such materials provide less charge trapping than a silicon nitride layer, which causes a high level of interface trap density and charge in the buried oxide layer. Thus, diffusion of dopants from and into semiconductor devices through the buried oxide layer is suppressed by the diffusion barrier layer without inducing a high interface trap density or charge in the buried oxide layer.

12 Claims, 8 Drawing Sheets

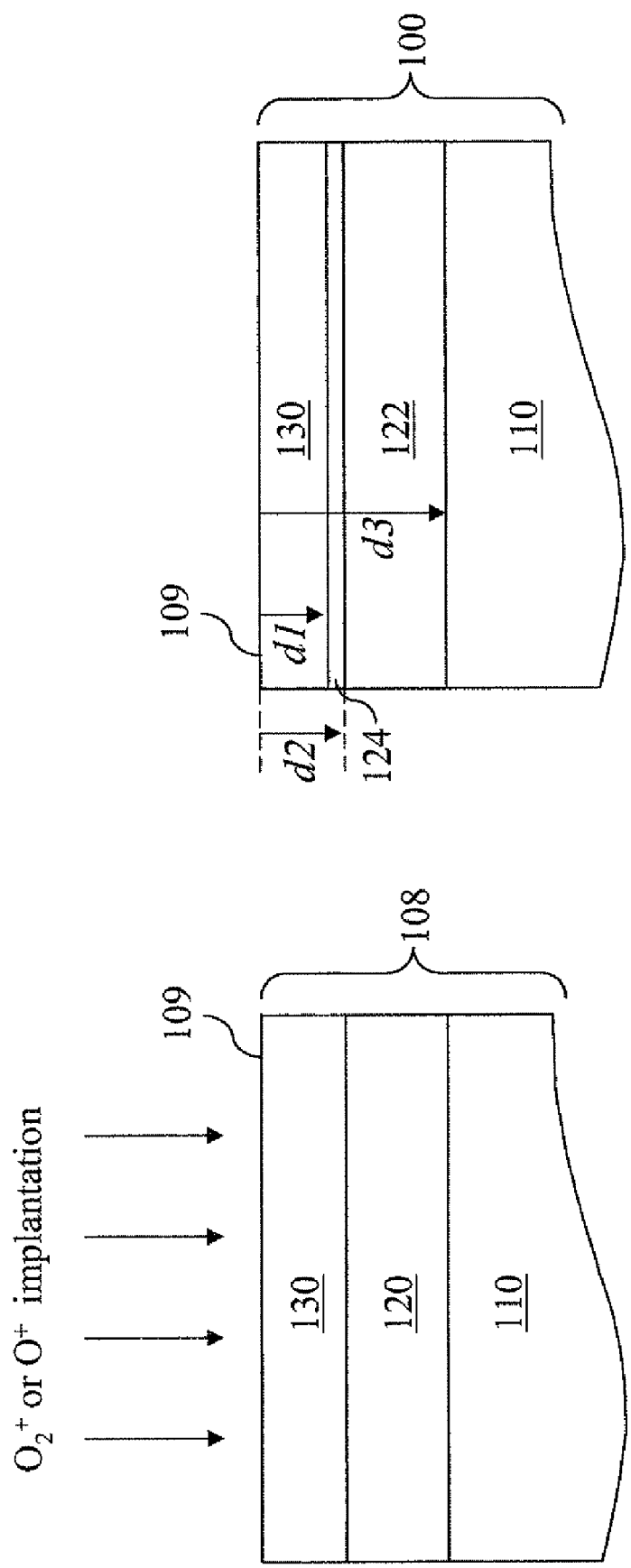

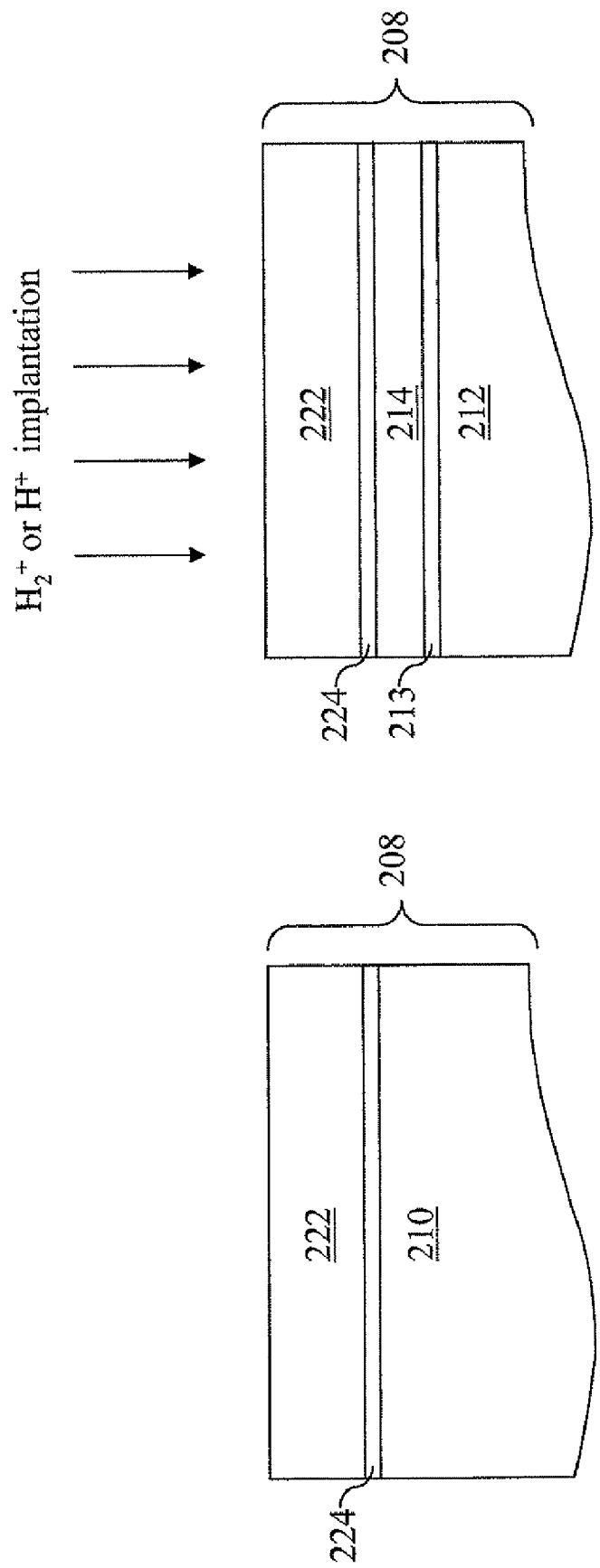

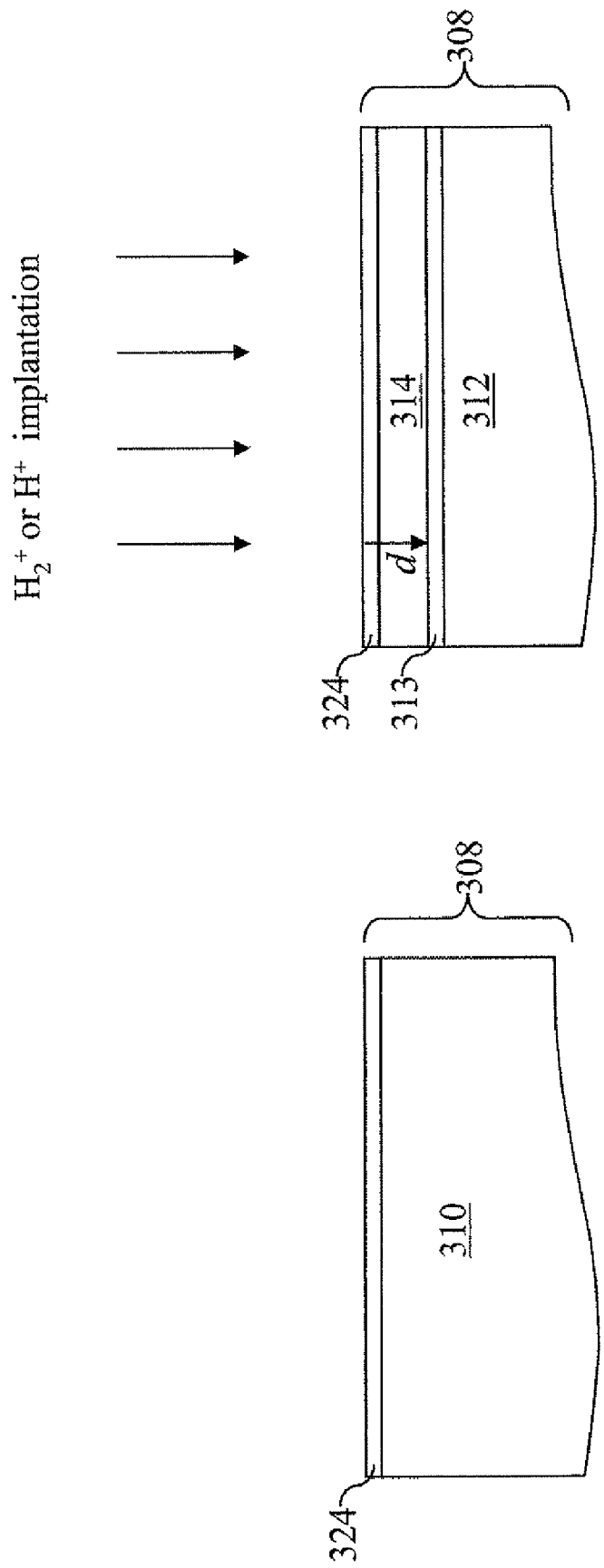

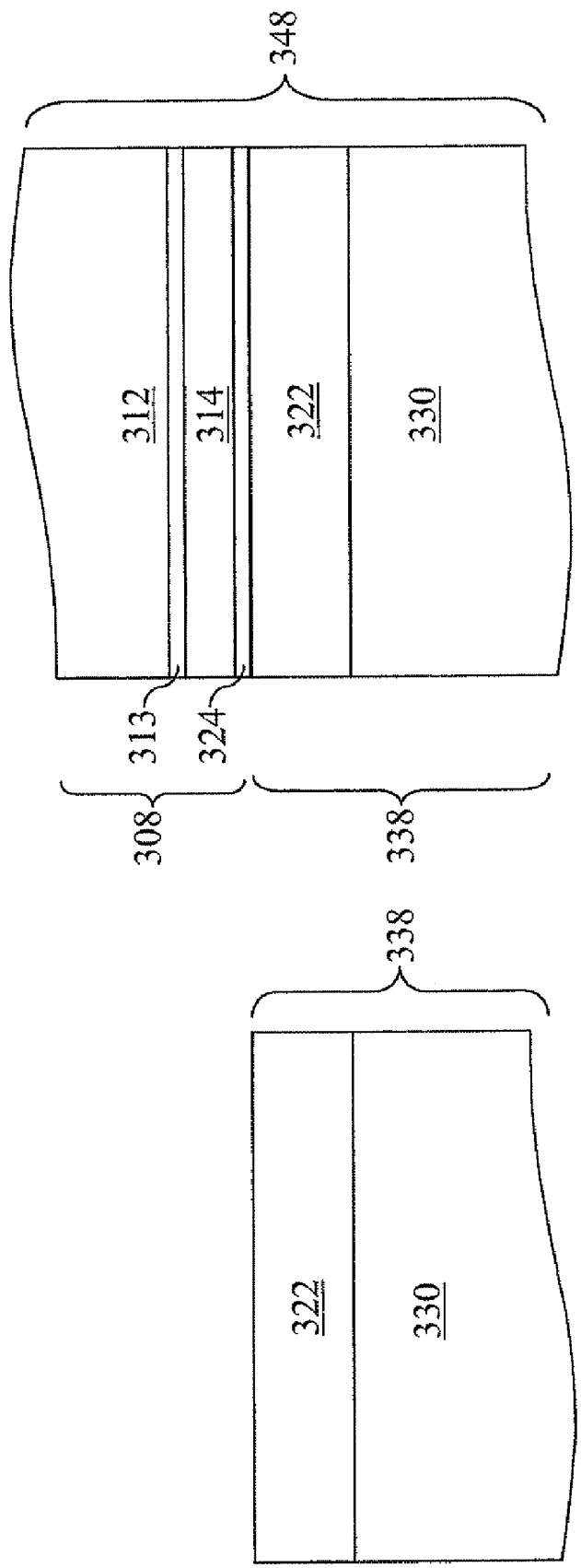

SEMICONDUCTOR-ON-INSULATOR SUBSTRATE WITH A DIFFUSION BARRIER

FIELD OF THE INVENTION

The present invention generally relates to semiconductor structures, and particularly to a semiconductor-on-insulator (SOI) substrate having a diffusion barrier layer between a top semiconductor layer and a buried insulator layer and methods of manufacturing the same.

BACKGROUND OF THE INVENTION

Semiconductor-on-insulator (SOI) devices are increasingly employed in high performance semiconductor chips for superior performance to bulk semiconductor devices. The SOI devices require a semiconductor-on-insulator (SOI) substrate including a buried insulator layer that provides electrical isolation to a top semiconductor layer from an underlying handle substrate.

Relative to a bulk substrate, the SOI substrate provides benefits such as lower parasitic capacitance and resistance to latch up. As for reduction of parasitic capacitance, a handle substrate is separated from a top semiconductor layer by the buried insulator layer so that the distance of capacitive coupling between devices in the top semiconductor layer and a handle substrate is significant. Further, the dielectric constant of the buried insulator layer is lower than the dielectric constant of typical semiconductor materials. For example, the dielectric constant of silicon oxide is about 3.9, while the dielectric constant of silicon is 11.8 and the dielectric constant of gallium arsenide is 12.85. Thus, the parasitic capacitive coupling of semiconductor devices formed above the buried oxide layer to the portion of the SOI substrate below the buried insulator layer is reduced significantly, which reduces power consumption of the semiconductor devices on the SOI substrate relative to semiconductor devices having matching performance and formed on a bulk substrate.

Further, SOI devices are more resistant to latchup since semiconductor devices are electrically isolated by a combination of shallow trench isolation and the buried insulator layer. In other words, parasitic bipolar transistors comprising a p-n-p type junction or an n-p-n type junction are not present in an SOI substrate. Elimination of such parasitic devices provide the advantage of latchup resistance to the semiconductor devices formed on the SOI substrate relative to semiconductor devices formed on a bulk substrate.

FIGS. 1A-1C show an exemplary prior art semiconductor manufacturing sequence. Referring to FIG. 1A, an exemplary prior art structure comprises a semiconductor substrate 8 containing a contiguous semiconductor layer 9 containing a semiconductor material such as silicon. Referring to FIG. 1B, the contiguous semiconductor layer 9 is implanted with oxygen to form an oxygen enriched layer 20 within the semiconductor substrate 8. The oxygen enriched layer 20 contains a high percentage of oxygen atoms as in a silicon oxide. The portion of the semiconductor substrate 8 above the oxygen enriched layer 20 constitutes a top semiconductor layer 30, and the portion of the semiconductor substrate below the oxygen enriched layer 20 constitutes a bottom semiconductor layer 10. Referring to FIG. 1C, the semiconductor substrate 8 is annealed at a high temperature about 1,300° C. to convert the oxygen enriched layer 20 into a buried insulator layer 22 containing silicon oxide.

As semiconductor devices scale down for enhanced performance of reduction of power consumption in each technology generation, variations in electrical characteristics of semiconductor devices tend to increase. For example, the ratio of a standard deviation in the physical length, called a "gate length," of a gate electrode across a channel of a field effect transistor relative to the mean of the physical lengths of the gate, or the "mean gate length," increases as the mean gate length decreases with scaling since improvements in lithographic tools and etch process tend to be insufficient to enhance accuracy of physical features of printed and etched structures at the same rate as the scaling of physical dimensions. Further, as devices shrink, some device characteristics that are determined by stochastic processes, such as a threshold voltage of a field effect transistor that is determined by stochastic distribution of dopant ions in an ion implantation process, are subject to more variation with scaling down of device dimensions.

For consistent performance of an integrated circuit, the electrical characteristics of semiconductor devices need to be consistent. Thus, controllable aspects of the variations in the electrical characteristics need to be controlled more tightly. One of the mechanisms of inducing variations in device characteristics in a semiconductor-on-insulator (SOI) substrate is diffusion of dopants (B, Ga, In, P, As, Sb. etc.) over time through isolations through the buried oxide layer in the SOI substrate. The diffusion of dopants may occur vertically or laterally through the buried oxide layer. The dopants may eventually diffuse into semiconductor devices located in the top semiconductor layer and cause shifts in device characteristics such as the threshold voltage (Vt) of a transistor. Another negative impact to device characteristics is loss of dopants from source and drain extension regions and deep source and drain regions into the buried insulator layer, which causes an increase in source resistance and/or drain resistance.

As scaling of semiconductor devices continues, the thickness of the top semiconductor layer decreases, making control of dopant diffusion to the buried insulator layer more critical. While thermal processing techniques, such as a laser anneal or a flash anneal, have been proposed to reduce diffusion of the dopant atoms in SOI devices, such techniques tend to significantly increase complexity of a semiconductor processing flow. Further, some processing steps, such as activation of dopants introduced into a polysilicon gate by on implantation, requires a high temperature thermal processing step that for dopant activation that invariably induces diffusion of dopants. Such processing steps make it difficult to provide an integration scheme that avoids diffusion of dopants introduced into the semiconductor devices during well level ion implantation steps, i.e., ion implantations steps prior to formation of a gate stack. For example, in semiconductor devices formed on an ultra-thin semiconductor-on-insulator (UTSOI) substrate having a 18 nm thick top semiconductor layer, increase in source and drain resistance that degrades the drive current of a p-type field effect transistor by more than 30% due to loss of boron atoms from the source and drain extension regions has been observed. In an n-type field effect transistor which employs a portion of a top semiconductor layer having a thickness of about 13 nm, loss of arsenic atoms from the source and drain regions may also cause degradation of device performance. Similar problems exist for dopant atoms introduced into a semiconductor device during halo ion implantations, since loss of dopant ions from the halo regions introduces negative impacts and device parameter variations.

In view of the above, there exists a need for a semiconductor structure providing beneficial effects of semiconductor-on-insulator substrate, while concurrently preventing diffusion of dopants into or out of a buried insulator layer, and methods of manufacturing the same without significantly increasing process complexity or cost.

SUMMARY OF THE INVENTION

The present invention addresses the needs described above by providing a semiconductor-on-insulator substrate containing a diffusion barrier layer for preventing diffusion of dopants into a buried insulator layer, and methods of manufacturing the same.

In the present invention, a diffusion barrier layer is incorporated between a top semiconductor layer and buried oxide layer. The diffusion barrier layer blocks diffusion of dopants into, or out of, the buried oxide layer. The diffusion barrier layer may comprise a dielectric material such as silicon oxynitride or a high-k gate dielectric material. Alternately, the diffusion barrier layer may comprise a semiconductor material such as SiC. Such materials provide less charge trapping than a silicon nitride layer, which causes a high level of interface trap density and charge in the buried oxide layer. Thus, diffusion of dopants from and into semiconductor devices through the buried oxide layer is suppressed by the diffusion barrier layer without inducing a high interface trap density or charge in the buried oxide layer.

According to an aspect of the present invention, a semiconductor structure is provided, which comprises:
 a handle substrate;
 a buried oxide layer abutting the handle substrate;
 a diffusion barrier layer abutting the buried oxide layer; and
 a top semiconductor layer comprising a semiconductor material.

The diffusion battier layer comprises a material that prevents diffusion of an electrical dopant therethrough, wherein the electrical dopant is selected from B, Ga, In, P, As, and Sb.

The diffusion barrier layer may comprise silicon oxynitride, a high-k dielectric material having a dielectric constant greater than 3.9, or silicon carbide.

The diffusion barrier layer may have a thickness from about 1 nm to about 10 nm and the top semiconductor layer comprises silicon.

In one embodiment, the semiconductor material may comprise silicon, the diffusion barrier layer may comprise silicon oxynitride, and the buried oxide layer may comprise silicon oxide.

According to another aspect of the present invention, a method of manufacturing a semiconductor structure is provided, which comprises:
 providing a semiconductor substrate containing a semiconductor material;
 implanting oxygen in the semiconductor substrate and forming an oxygen enriched layer, wherein a top semiconductor layer and a bottom semiconductor layer are formed directly above and directly below the oxygen enriched layer, respectively; and
 converting the oxygen enriched layer into an oxide layer and forming an oxynitride layer between the oxide layer and the top semiconductor layer.

In one embodiment, the method further comprises annealing the semiconductor substrate in an ambient containing a mixture of an oxidizing gas and a nitridating gas, wherein the oxidizing gas and the nitridating gas diffuse through the top semiconductor layer and react with the oxygen enriched layer to concurrently form the oxynitride layer and the buried oxide layer.

In another embodiment, the method further comprises:
 annealing the semiconductor substrate in an ambient containing an oxidizing gas, wherein the annealing converts the oxygen enriched layer to the oxide layer; and
 annealing the semiconductor substrate in an ambient containing a nitridating gas, wherein the nitridating gas diffuses through the top semiconductor layer and forms the oxynitride layer at an interface between the substrate layer and the oxide layer.

According to even another aspect of the present invention, another method of manufacturing a semiconductor structure is provided, which comprises:
 forming an oxide layer and an oxynitride layer on a semiconductor substrate, wherein the diffusion barrier layer abuts the oxide layer and a semiconductor layer in the semiconductor substrate;
 implanting hydrogen into the semiconductor substrate to form a hydrogen implanted layer;
 bonding a handle substrate directly on the oxide layer to form a bonded substrate; and
 cleaving the bonded substrate at the hydrogen implanted layer.

In one embodiment, the method further comprises annealing the semiconductor substrate in an ambient containing a mixture of an oxidizing gas and a nitridating gas to oxidize the semiconductor layer to form the oxide layer and to partially nitridate the oxide layer at an interface between the semiconductor substrate and the oxide layer to form the oxynitride layer.

In another embodiment, the method further comprises:
 annealing the semiconductor substrate in an ambient containing an oxidizing gas, wherein the annealing converts a portion of the semiconductor substrate to the oxide layer by thermal oxidation; and
 annealing the semiconductor substrate in an ambient containing a nitridating gas, wherein the nitridating gas diffuses through the top semiconductor layer and forms the oxynitride layer at an interface between the semiconductor substrate and the oxide layer.

According to yet another aspect of the present invention, yet another method of manufacturing a semiconductor structure is provided, which comprises:
 forming a diffusion barrier layer on a first semiconductor substrate;
 hydrogen into the semiconductor substrate to form a hydrogen implanted layer;
 forming a silicon oxide layer on a second semiconductor substrate;
 bonding the first semiconductor substrate and the second semiconductor substrate to form a bonded substrate; and
 cleaving the bonded substrate at the hydrogen implanted layer.

BRIEF DESCRIPTION OF THE DRAWINGS

FIGS. 2A-2C are sequential cross-sectional views of a first exemplary semiconductor structure according to a first embodiment of the present invention.

FIGS. 3A-3D are sequential cross-sectional views of a second exemplary semiconductor structure according to a second embodiment of the present invention.

FIGS. 4A-4E are sequential cross-sectional view of a third exemplary semiconductor structure according to a third embodiment of the present invention.

DETAILED DESCRIPTION OF THE INVENTION

Figure 1B:
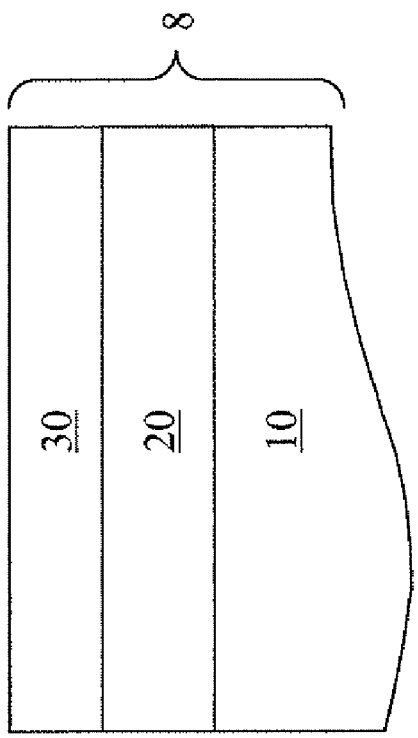
FIGS. 1A-1C are sequential vertical cross-sectional views of an exemplary prior art structure for a semiconductor-on-insulator substrate.
Figure 1A:
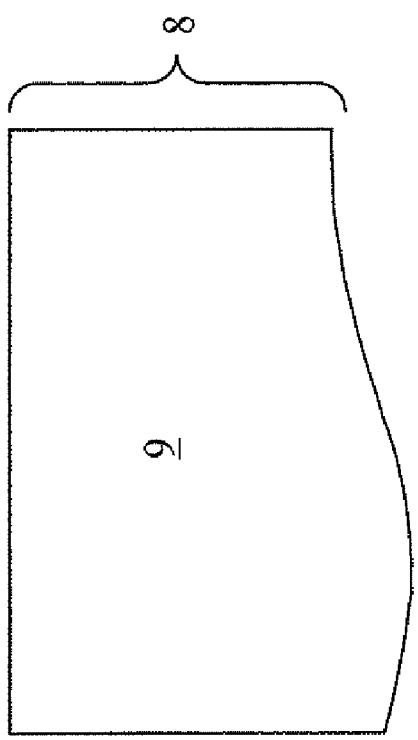

As stated above, the present invention relates to a semiconductor-on-insulator (SOI) substrate having a diffusion barrier layer between a top semiconductor layer and a buried insulator layer and methods of manufacturing the same, which are now described in detail with accompanying figures. It is noted that like and corresponding elements are referred to by like reference numerals.

Figure 2A:
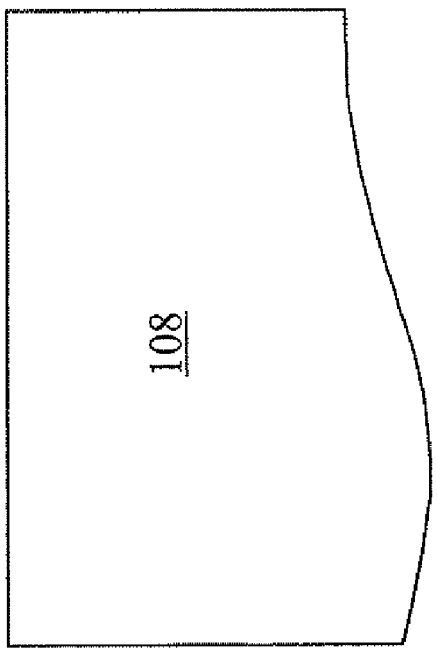
Figure 1C:
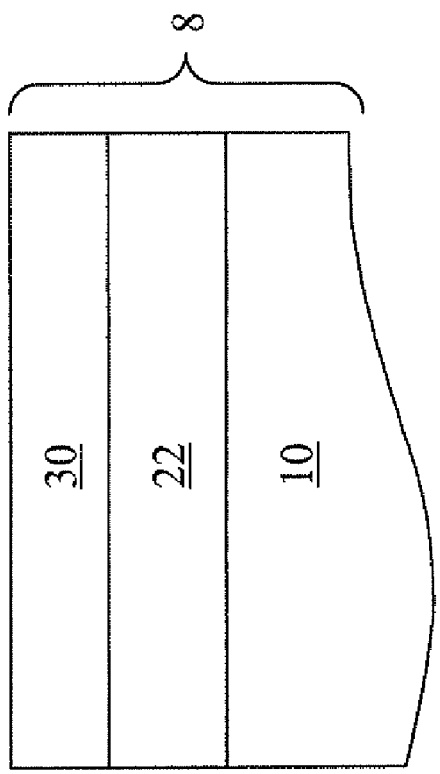

Referring to FIG. 2A, a first exemplary semiconductor structure according to a first embodiment of the present invention comprises a semiconductor substrate 108. The semiconductor substrate 108 may be a bulk substrate at this point. The semiconductor substrate 108 comprises a semiconductor material such as silicon, a silicon germanium alloy, a silicon carbon alloy, a silicon germanium carbon alloy, a III-V compound semiconductor material, or a II-VI compound semiconductor material. The semiconductor material forms an insulating oxide when reacted with oxygen.

Referring to FIG. 2B, molecular oxygen ions ($O_2^+$) or atomic oxygen ions ($O^+$) are implanted into the semiconductor substrate 108 in a high dose. Methods of forming a buried oxide layer by implanting oxygen ions followed by an anneal to form a buried oxide layer are known in the art as separation by ion implantation of oxygen (SIMOX). The molecular oxygen ions ($O_2^+$) or atomic oxygen ions ($O^+$) are implanted into the semiconductor substrate employing conventional SIMOX processes and conditions that are well known to those skilled in the art, as well as the various SIMOX processes and conditions mentioned in co-assigned U.S. Pat. Nos. 6,090,689; 5,930,634; and 5,930,643 to Sadana et al, U.S. Pat. No. 6,043,166 to Roitman et al., U.S. Pat. No. 5,658,809 to Nakashima et al., U.S. Pat. No. 6,486,037 to Norcott, et al., U.S. Pat. No. 6,541,356 to Fogel, et al., U.S. Pat. No. 6,602,757 to Hovel, et al., and U.S. Pat. No. 6,846,727 to Fogel, et al. The entire contents of each are incorporated herein by reference. The implant may be a blanket implant as shown in FIG. 2B or a patterned implant may be employed. The patterned implant may include a dielectric mask formed on a top surface 109 of the semiconductor substrate 108 may be employed.

Although various implant conditions can be employed in the present invention, the following provides general implant conditions for forming an oxygen enriched layer 120 within the structure shown in FIG. 2B: The dose of implanted molecular oxygen ions ($O_2^+$) or atomic oxygen ions ($O^+$) is greater than $1.0 \times 10^{16}/cm^2$, and preferably greater than $1.0 \times 10^{17}/cm^2$. Typically, beam current density for such an ion implantation process is greater than $0.05$ mA/cm$^2$. Energy of the implanted molecular oxygen ions ($O_2^+$) or atomic oxygen ions ($O^+$) is greater than 20 keV, with an energy of greater than 50 keV being even more preferred. This implant, which may be performed in a single step or multiple steps, is carried out at a temperature of greater than 200° C., with an implantation temperature of greater than 350° C. being even more preferred. The implant conditions are exemplary and by no way limit the scope of the present invention. Instead, the present invention contemplates all conventional ion implantation conditions that are typically employed in conventional SIMOX processes.

The portion of the semiconductor substrate 108 above the oxygen enriched layer 120 constitutes a top semiconductor layer 130. The portion of the semiconductor substrate 108 below the oxygen enriched layer 120 constitutes a bottom semiconductor layer 110. The top semiconductor layer 130 and the bottom semiconductor layer 110 contain the same semiconductor material as the original semiconductor substrate 108 prior to the formation of the oxygen implantation layer 120.

Referring to FIG. 2C, the semiconductor substrate 108 is annealed at a high temperature to convert the oxygen enriched layer 120 into a buried oxide layer 122 and to form a diffusion barrier layer which is an oxynitride layer 124. The semiconductor substrate 108 thus becomes a semiconductor-on-insulator (SOI) substrate 100 containing the top semiconductor layer 130, an oxynitride layer 124, a buried oxide layer 122, and a bottom semiconductor layer 110.

The buried oxide layer 122 and the oxynitride layer 124 may be concurrently formed in an anneal by subjecting the semiconductor substrate 108 to an ambient containing a mixture of an oxidizing gas and a nitridating gas. For example, the oxidizing gas may be $O_2$ or $H_2O$, and the nitridating gas may be $N_2$, NO, or $N_2O$. Preferably, the oxidizing gas is $O_2$ and the nitridating gas is $N_2$. The ratio of the nitridating gas to the oxidizing gas in molar concentration is less than 0.1, and preferably less than 0.01, so that the ambient of the anneal process is predominantly oxidizing, while nitridation process occurs at an interface between the buried oxide layer 122 and the top semiconductor layer 130.

The temperature of the anneal is typically about 1,300° C. Temperature ranges known in the art for formation of conventional SIMOX processes may be employed. For example, anneal temperature ranges disclosed in the above referenced U.S. patents may be employed to practice the present invention.

The conversion of the oxygen enriched layer 120 into the buried oxide layer 122 and formation of the oxynitride layer 124 may be concurrent, i.e., may occur simultaneously. The oxidizing gas and the nitridating gas diffuse through the top semiconductor layer 130 and react with the oxygen enriched layer 120, while the nitridating gas forms the oxynitride layer 124 at the interface between the top semiconductor layer 130 and the buried insulator layer 122 thus formed. The buried oxide layer 122 comprises an oxide of the semiconductor material of the semiconductor substrate 108 as originally provided prior to implantation of the molecular oxygen ions ($O_2^+$) or atomic oxygen ions ($O^+$). Thus, the buried oxide layer 122 comprises an oxide derived from the semiconductor material of the top semiconductor layer 130 and the bottom semiconductor layer 110. For example, the buried oxide layer 122 may comprise silicon oxide and the top semiconductor layer 130 and the bottom semiconductor layer 110 may comprise silicon.

Alternately, the buried oxide layer 122 and the oxynitride layer 124 may be sequentially formed in two anneal steps by first subjecting the semiconductor substrate 108 in an ambient containing an oxidizing gas such as $O_2$ or $H_2O$, and subsequently subjecting the semiconductor substrate 108 to another ambient containing a nitridating gas such as $N_2$, NO, or $N_2O$. The first anneal in the oxidizing gas converts the oxygen enriched layer 120 into the buried oxide layer 122. The mechanism and method of the first anneal is known in the art, for example, in the above referenced U.S. patents. After the first anneal, the second anneal in the nitridating ambient causes the nitridating gas to diffuse through the top semiconductor layer 130 and form the oxynitride layer 124 at the interface between the top semiconductor layer 130 and the buried oxide layer 122.

The oxynitride layer 124 is a diffusion barrier layer that prevents diffusion of an electrical dopant therethrough. The electrical dopant may be one of B, Ga, In, P, As, and Sb.

Typically, compared to an oxide of a semiconductor material, an oxynitride of the semiconductor generates lower levels of interfacial defect density and trapped charge. For example, a silicon nitride layer formed on silicon is known to generate a high level of interfacial defect density.

The interface between the top semiconductor layer 130 and the oxynitride layer 124 is located at a first depth d1 from the top surface 109 of the SOI substrate 100. The interface between the oxynitride layer 124 and the buried oxide layer 122 is located at a second depth d2 from the top surface 109 of the SOI substrate 100. The interface between the buried oxide layer 122 and the bottom semiconductor layer 110 is located at a third depth d3 from the top surface 109 of the SOI substrate 100. The first depth d1, which is the thickness of the top semiconductor layer 130 may be from about 5 nm to about 200 nm, and typically from about 10 nm to about 80 nm, although lesser and greater thicknesses are also explicitly contemplated herein. The thickness of the oxynitride layer 124, which is the difference between the second depth d2 and the first depth d1, may be from about 0.5 nm to about 20 nm, and preferably from about 1 nm to about 10 nm, and more preferably from about 1 nm to about 3 nm, although lesser and greater thicknesses are also explicitly contemplated herein. The composition of the oxynitride layer 124 may vary gradually from the composition of the buried oxide layer 122 since nitridation of the semiconductor material in the top semiconductor layer 130 occurs preferentially near the top semiconductor layer 130. The thickness of the buried oxide layer 122, which is the difference between the third depth d3 and the second depth d2, may be from about 50 nm to about 300 nm, and typically from about 100 nm to about 200 nm, although lesser and greater thicknesses are also explicitly contemplated herein.

Referring to FIG. 3A, a second exemplary semiconductor structure according to a second embodiment of the present invention comprises a first semiconductor substrate 208 which contains a first semiconductor layer 210. An oxide layer 222 and an oxynitride layer 224 are formed in the first semiconductor substrate 208. The oxide layer 222 may be formed by thermal oxidation of the semiconductor material in a top portion of the first semiconductor layer 210, and the oxynitride layer 224 may be formed by diffusing a nitridating gas through the oxide layer 222 and causing reaction of the nitridating gas with the semiconductor material in the first semiconductor layer 210 at an interface with the first semiconductor layer.

The thermal oxidation of the top portion of the first semiconductor layer 210 to form the oxide layer 222 and formation of the oxynitride layer 124 may be concurrent or sequential. In case the oxide layer 222 and the oxynitride layer 224 are formed concurrently, the first semiconductor substrate 208 is subjected to a combined oxidation and nitridation process which is an anneal in an ambient containing a mixture of an oxidizing gas and a nitridating gas. The oxidizing gas and the nitridating gas may be the same as in the first embodiment. The ratio of the nitridating gas to the oxidizing gas in molar concentration is less than 0.1, and preferably less than 0.01, so that the ambient of the anneal process is predominantly oxidizing. A nitridation process occurs at an interface between the oxide layer 222 and the first semiconductor layer 210.

The temperature of the anneal process is sufficient to cause oxidation and nitridation of the top portion of the first semiconductor layer 210. For example, the temperature of the anneal may be from about 650° C. to about 1,400° C., and preferably from about 800° C. to about 1,100° C. During the anneal, the oxidizing gas oxidizes the top portion of the first semiconductor layer 210 to form the oxide layer 222. The nitridating gas diffuse through the oxide layer 222 and react with first semiconductor layer 210 to form the oxynitride layer 224. Thus, the oxide layer 222 comprises an oxide of the semiconductor material that the first semiconductor layer 210 comprises. For example, the oxide layer 222 may comprise silicon oxide and the first semiconductor layer 210 may comprise silicon.

Alternately, the oxide layer 222 and the oxynitride layer 124 may be sequentially formed in two processing steps comprising an oxidation process and a subsequent nitridation process. The oxidation process is an anneal in an oxidizing ambient, which may contain an oxidizing gas such as $O_2$ or $H_2O$. An oxide layer 222 is formed directly on the first semiconductor layer 210 by thermal conversion of a top portion of the first semiconductor layer 210 into the oxide layer 222. Subsequently, the semiconductor substrate 208 containing the first semiconductor layer 210 and the oxide layer 222 is subjected to another anneal in a nitridating ambient. The nitridating ambient may contain a nitridating gas such as $N_2$, NO, or $N_2O$. The nitridating gas diffuses through the oxide layer 222 and forms the oxynitride layer 224 at the interface between the first semiconductor layer 210 and the oxide layer 222.

The thickness of the oxynitride layer 224 may be from about 0.5 nm to about 20 nm, and preferably from about 1 nm to about 10 nm, and more preferably from about 1 nm to about 3 nm, although lesser and greater thicknesses are also explicitly contemplated herein. The composition of the oxynitride layer 224 may vary gradually from the composition of the buried oxide layer 122 since nitridation of the semiconductor material in the first semiconductor layer 210 occurs preferentially near the oxide layer 222. The thickness of the oxide layer 222 may be from about 50 nm to about 300 nm, and typically from about 100 nm to about 200 nm, although lesser and greater thicknesses are also explicitly contemplated herein.

Referring to FIG. 3B, molecular hydrogen ions ($H_2^+$) or atomic hydrogen ions ($H^+$) implanted into the first semiconductor substrate into a depth that exceeds the depth of the oxynitride layer 224 to form a hydrogen implanted layer 213. The first semiconductor layer 210 is separated into a top semiconductor layer 214 located between the oxynitride layer 224 and the hydrogen implanted layer 213 and a release substrate 212 located below the hydrogen implanted layer 213. Processes and conditions for forming the hydrogen implantation layer 213 are well known to those skilled in the art. For example, the various separation by hydrogen implantation processes and conditions described in U.S. Pat. Nos. 5,374,564 and 5,714,395 to Bruel, U.S. Pat. No. 6,372,609 to Aga et al., U.S. Pat. No. 6,613,678 to Sagaguchi et al., U.S. Pat. No. 7,081,399 to Maleville et al. may be employed, the entire contents of which are incorporated herein by reference.

The thickness of the top semiconductor layer 214 may be from about 5 nm to about 200 nm, and typically from about 10 nm to about 80 nm, although lesser and greater thicknesses are explicitly contemplated herein.

Figure 3D:
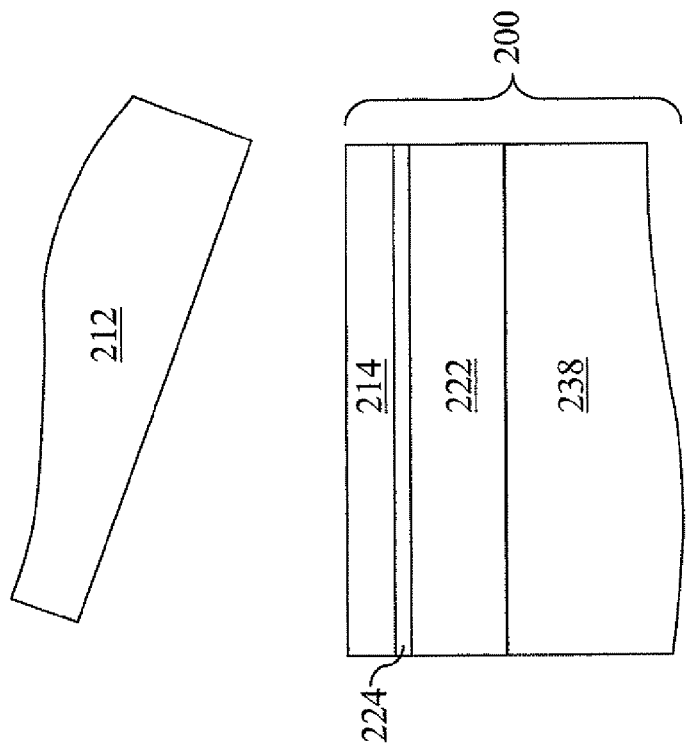
Figure 3C:
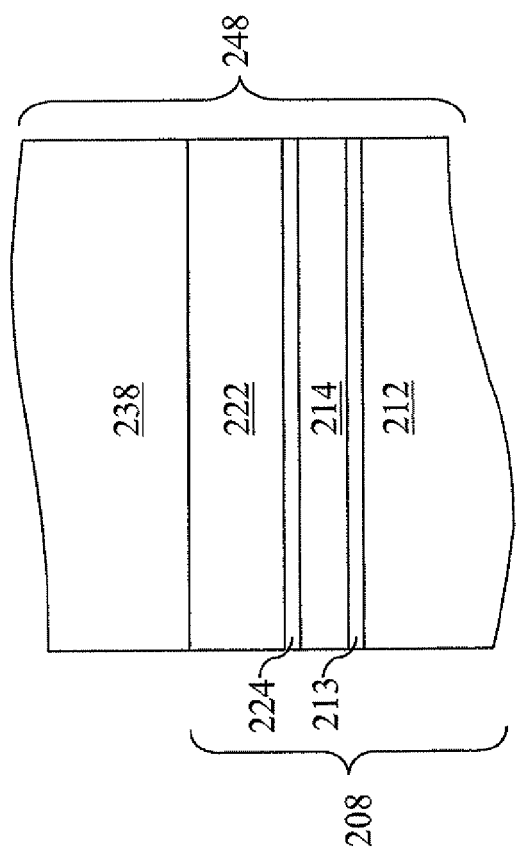

Referring to FIG. 3C, a second semiconductor substrate 238 is bonded to the oxide layer 222 of the first semiconductor substrate 208 employing methods known in the art. For example, the second semiconductor substrate 238 may be brought to contact with the oxide layer 222 and annealed to promote adhesion of the oxide layer 222 to the second semiconductor substrate 238. The first semiconductor substrate 208 and the second semiconductor substrate 238 collectively constitutes a bonded substrate 248.

Referring to FIG. 3D, the bonded substrate 248 is separated into a semiconductor-on-insulator (SOI) substrate 200 and a release substrate 212 at the hydrogen implanted layer 213.

Methods of cleaving the bonded substrate 248 by an anneal is well known in the art, and described, for example, in the above referenced U.S. patents on separation by hydrogen implantation processes and conditions.

The oxide layer 222 located in the SOI substrate 200 is buried between the top semiconductor layer 214 and the second semiconductor substrate 238. Thus, the oxide layer 222 is a buried oxide layer of the SOI substrate 200. The second semiconductor substrate 238 is a handle substrate of the SOI substrate 200. The oxynitride layer 224 prevents diffusion of dopant out of or into the top semiconductor layer 214. Thus, the oxynitride layer 224 is a diffusion barrier layer that prevents diffusion of an electrical dopant therethrough. The electrical dopant may be one of B, Ga, In, P, As, and Sb.

The oxynitride layer 224 is derived from the semiconductor material of the top semiconductor layer 214, which may comprise the same material as, or a different material from, the material of the second semiconductor layer 238. For example, the top semiconductor layer 214 may comprise silicon, the oxynitride layer 224 may comprise silicon oxynitride, and the second semiconductor substrate 238 may comprise silicon, silicon germanium alloy, silicon carbide, or other semiconductor materials.

Referring to FIG. 4A, a third exemplary semiconductor structure according to a third embodiment of the present invention comprises a first semiconductor substrate 308 that contains a first semiconductor layer 310 and a diffusion barrier layer 324. The diffusion barrier layer 324 may comprise a high-k dielectric material having a dielectric constant greater than 3.9 or silicon carbide. A high-k dielectric material may be a metal oxide, a metal oxynitride, a metal silicate, and alloys, mixtures, or multilayers of the same. The high-k dielectric materials are typically referred to as high-k gate dielectric materials, which are employed in advanced semiconductor devices to enable scaling of state-of-the-art field effect transistors. Non-limiting examples of the high-k dielectric materials include hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate.

The high-k dielectric materials and silicon carbide provide low interfacial defect density in the first semiconductor layer 310. In general, high-k dielectric materials employed in a gate stack requires a low interfacial defect density to provide a high drive current in a transistor. This property of the high-k dielectric materials is advantageously employed in the present invention and an interface with a low interfacial defect density is provided between the first semiconductor layer 310 and the diffusion barrier layer 324. Similarly, silicon carbide provides low interfacial density.

The thickness of the diffusion barrier layer 324 may be from about 1 nm to about 10 nm, although lesser and grater thicknesses are also explicitly contemplated herein.

Referring to FIG. 4B, a hydrogen implanted layer 313 is formed in the first semiconductor layer 310 by implanting molecular hydrogen ions ($H_2^+$) or atomic hydrogen ions ($H^+$) into the first semiconductor substrate 308 below the oxynitride layer 324 to form a hydrogen implanted layer 313. Method of implanting hydrogen ions described in the second embodiment may be employed.

The remaining portion of the first semiconductor layer 310 is divided into a top semiconductor layer 314 and a release substrate 312 by the hydrogen implanted layer 313. The top semiconductor layer 314 is located between the diffusion barrier layer 324 and the hydrogen implanted layer 313. The thickness of the top semiconductor layer 314 may be from about 5 nm to about 200 nm, and typically from about 10 nm to about 80 nm, although lesser and greater thicknesses are explicitly contemplated herein. The release substrate 312 is located below the hydrogen implanted layer 313. The depth d of the hydrogen implanted layer 313 is the sum of the thickness of the diffusion barrier layer 324 and the thickness of the top semiconductor layer 314.

Referring to FIG. 4C, a second semiconductor substrate 338 containing a second semiconductor layer 330 and an oxide layer 322 are provided. The oxide layer 322 may be formed by thermal oxidation of a top portion of the semiconductor layer 330. The thickness of the oxide layer 322 may be from about 50 nm to about 300 nm, and typically from about 100 nm to about 200 nm, although lesser and greater thicknesses are also explicitly contemplated herein.

Referring to FIG. 4D, the oxide layer 322 of the second semiconductor substrate 338 is bonded to the diffusion barrier layer 324 of the first semiconductor substrate 308 employing methods known in the art. For example, the oxide layer 322 of the second semiconductor substrate 338 may be brought to contact with the diffusion barrier layer 324 and annealed to promote adhesion of the oxide layer 322 to the first semiconductor substrate 308. The first semiconductor substrate 308 and the second semiconductor substrate 338 collectively constitutes a bonded substrate 348.

Figure 4E:
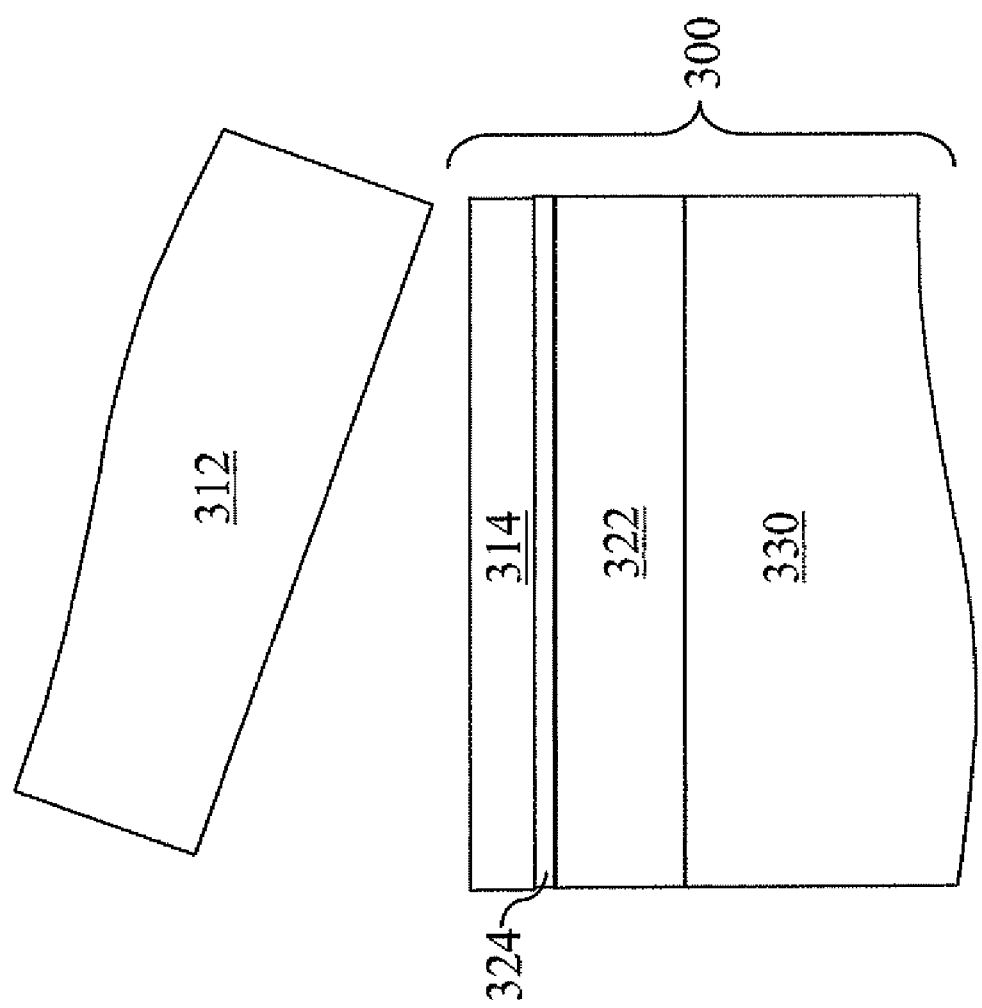

Referring to FIG. 4E, the bonded substrate 348 is separated into a semiconductor-on-insulator (SOI) substrate 300 and a release substrate 312 at the hydrogen implanted layer 313. Methods of cleaving the bonded substrate 348 by an anneal is well known in the art, and described, for example, in the above referenced U.S. patents on separation by hydrogen implantation processes and conditions.

The oxide layer 322 located in the SOI substrate 300 is buried between the top semiconductor layer 314 and the second semiconductor layer 330. Thus, the oxide layer 322 is a buried oxide layer of the SOI substrate 300. The second semiconductor layer 330 is a handle substrate of the SOI substrate 300. The diffusion barrier layer 224 prevents diffusion of an electrical dopant out of, or into, the top semiconductor layer 314. The electrical dopant may be one of B, Ga, In, P, As, and Sb.

The top semiconductor layer 314 and the second semiconductor layer 330 may be any semiconductor material, and may be the same, or different. Each of the top semiconductor layer 314 and the second semiconductor layer 330 may be selected from silicon, a silicon germanium alloy, a silicon carbon alloy, a silicon germanium carbon alloy, a III-V compound semiconductor material, or a II-VI compound semiconductor material.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A method of forming a semiconductor structure comprising:

forming a diffusion barrier layer directly on a semiconductor surface of a first semiconductor substrate;

implanting hydrogen through said diffusion barrier layer into said semiconductor substrate to form a hydrogen implanted layer within said first semiconductor substrate;

forming a silicon oxide layer on a second semiconductor substrate;

bonding said first semiconductor substrate and said second semiconductor substrate to form a bonded substrate; and cleaving said bonded substrate at said hydrogen implanted layer.

2. The method of claim 1, wherein said diffusion barrier layer comprises silicon oxynitride.

3. The method of claim 1, wherein said diffusion barrier layer comprises a high-k dielectric material is selected from the group consisting of a metal oxide, a metal oxynitride, a metal silicate, and alloys, mixtures, or multilayers of the same, wherein said high-k dielectric material has a dielectric constant greater than 3.9.

4. The method of claim 1, wherein said diffusion barrier layer comprises silicon carbide.

5. The method of claim 1, wherein said silicon oxide layer is formed directly on a semiconductor surface of said second semiconductor substrate.

6. The method of claim 1, wherein said first semiconductor substrate includes a stack of a release substrate, said hydrogen implanted layer, a top semiconductor layer, and said diffusion barrier layer upon formation of said hydrogen implanted layer.

7. The method of claim 1, wherein said silicon oxide layer is formed by thermal oxidation of a top portion of said second semiconductor substrate.

8. The method of claim 1, wherein said bonded substrate prior to said cleaving includes a stack, from bottom to top, of a semiconductor layer within said second semiconductor substrate, said semiconductor oxide layer, said diffusion barrier layer, a top semiconductor layer within said first semiconductor substrate, said hydrogen implanted layer, and a release substrate within said first semiconductor substrate.

9. The method of claim 1, wherein said bonded substrate prior to said cleaving consists of a stack, from bottom to top, of a semiconductor layer within said second semiconductor substrate, said semiconductor oxide layer, said diffusion barrier layer, a top semiconductor layer within said first semiconductor substrate, said hydrogen implanted layer, and a release substrate within said first semiconductor substrate.

10. The method of claim 1, wherein a surface of said diffusion barrier layer on said first semiconductor substrate and a surface of said silicon oxide layer on said second semiconductor substrate are directly bonded during said bonding to form bonded substrate.

11. The method of claim 1, wherein said diffusion barrier layer comprises a metal oxide having a dielectric constant greater than 3.9 or a metal oxynitride having a dielectric constant greater than 3.9.

12. The method of claim 1, wherein said diffusion barrier layer comprises a metal silicate having a dielectric constant greater than 3.9.

\* \* \* \* \*